(12) United States Patent
Urbano (10) Patent No.: US 11,239,041 B2
(45) Date of Patent: Feb. 1, 2022

(54) MULTI-STAGE VACUUM EQUIPMENT WITH STAGES SEPARATION CONTROLLED BY SMA ACTUATOR

(71) Applicant: Saes Getters S.p.A., Lainate (IT)

(72) Inventor: Marco Urbano, Milan (IT)

(73) Assignee: Saes Getters S.p.A., Lainate (IT)

(*) Notice: Subject to any disclaimer, the term of this patent is extended or adjusted under 35 U.S.C. 154(b) by 0 days.

(21) Appl. No.: 16/973,167

(22) PCT Filed: Jul. 19, 2019

(86) PCT No.: PCT/IB2019/056189
§ 371 (c)(1),
(2) Date: Dec. 8, 2020

(87) PCT Pub. No.: WO2020/016843
PCT Pub. Date: Jan. 23, 2020

(65) Prior Publication Data
US 2021/0249217 A1  Aug. 12, 2021

(30) Foreign Application Priority Data
Jul. 19, 2018  (IT) .............. 1020180007349

(51) Int. Cl.
*H01J 37/00* (2006.01)
*H01J 37/09* (2006.01)
*H01J 37/28* (2006.01)

(52) U.S. Cl.
CPC .............. *H01J 37/09* (2013.01); *H01J 37/28* (2013.01); *H01J 2237/0453* (2013.01); *H01J 2237/188* (2013.01)

(58) Field of Classification Search
USPC .......................................... 250/428
See application file for complete search history.

(56) References Cited

U.S. PATENT DOCUMENTS

| | | | | |
|---|---|---|---|---|
| 4,528,451 A | * | 7/1985 | Petrie | H01L 21/68 219/121.24 |
| 4,584,479 A | * | 4/1986 | Lamattina | F16J 15/006 219/121.22 |
| 4,833,362 A | * | 5/1989 | Crewe | H01J 37/073 313/311 |

(Continued)

FOREIGN PATENT DOCUMENTS

EP  1526563 A1  4/2005
JP  H06-36166 A  2/1994

OTHER PUBLICATIONS

International Search Report dated Dec. 12, 2019 in PCT/IB2019/056189, 6 pages.

(Continued)

*Primary Examiner* — Phillip A Johnston
(74) *Attorney, Agent, or Firm* — Element IP, PLC (57) ABSTRACT

The present invention relates to a multi-stage vacuum equipment, preferably a two-stage equipment, whose normal operation requires different pressures to be set, wherein the pressure variation may be achieved by a Shape Memory Alloy (SMA) wire movement of a suitable element. The invention further discloses a method for operating said multi-stage vacuum equipment controlled by a SMA actuator.

19 Claims, 9 Drawing Sheets

(56) References Cited

U.S. PATENT DOCUMENTS

| | | | | |
|---|---|---|---|---|
| 5,459,544 | A * | 10/1995 | Emura | G03B 9/00 |
| | | | | 396/257 |
| 5,967,409 | A * | 10/1999 | Benedict | G05D 23/025 |
| | | | | 236/101 D |
| 6,555,815 | B2 * | 4/2003 | Feuerbaum | H01J 37/026 |
| | | | | 250/306 |
| 6,967,335 | B1 | 11/2005 | Dyer et al. | |
| 7,288,774 | B1 * | 10/2007 | Koch | H01J 37/02 |
| | | | | 250/441.11 |
| 7,435,973 | B2 * | 10/2008 | Koops | H01J 37/3056 |
| | | | | 250/306 |
| 7,569,838 | B2 * | 8/2009 | Watanabe | H01J 37/224 |
| | | | | 250/306 |
| 7,781,743 | B2 | 8/2010 | Katagiri et al. | |
| 2009/0045337 | A1 | 2/2009 | Kimura | |
| 2011/0139986 | A1 * | 6/2011 | Ohta | H01J 37/265 |
| | | | | 250/311 |

OTHER PUBLICATIONS

Written Opinion dated Dec. 12, 2019 in PCT/IB2019/056189, 8 pages.

* cited by examiner

MULTI-STAGE VACUUM EQUIPMENT WITH STAGES SEPARATION CONTROLLED BY SMA ACTUATOR

The present invention relates to a multi-stage vacuum equipment, preferably a two-stage equipment, whose normal operation requires different pressures to be set, varied and subsequently maintained in the vacuum equipment stages, wherein the pressure variation may be achieved by a Shape Memory Alloy (SMA) wire actuator through the movement of a suitable shutter that controls the inflow of a process gas in the higher pressure stages.

Among the most interesting vacuum equipment according to the present invention there are the charged particle apparatuses, such as a SEM (Scanning Electron Microscope) that produces images of a specimen by scanning its surface with a focused beam of electrons. Specimens are observed in both a high vacuum stage and a low vacuum stage, and since the high vacuum stage minimizes scattering of the electron beam before reaching the specimen, then the electron gun and the primary electron beam passage are kept in high vacuum conditions.

The detectors can be used also in the so-called "low vacuum" operational mode, in which a small amount of gas is leaked into the chamber, where it ionizes and reduces surface charging of insulating materials. In this case it is necessary to limit the gas flow from the sample chamber to the microscope column and this is accomplished by reducing the objective aperture, that is typically in the range of 5-10 mm, to a much smaller value of e.g. 0.5-1 mm or even smaller diameters. One method to reduce the objective aperture consists in introducing inside the objective aperture an appendage with a hole located along the primary beam axis and having a diameter much smaller than the original diameter.

This solution allows low vacuum measurements but has the drawback to reduce the field of view of the microscope and to strongly limit the backscattered electron detection by detectors placed inside the microscope column. For this reason, when high vacuum measurements are needed, the appendage is removed. The appendage installation and removal implies opening the specimen chamber to air, closing the chamber and waiting for a long reconditioning (pumping air out) of the chamber.

Several solutions have been disclosed in order to provide a vacuum equipment including a channel aperture and mechanism performing operations to automatically attach or detach an aperture member to allow for the vacuum equipment operation in different pressure regimes, for example US patent application 20110006209 describes an electron beam apparatus which has an electron optical column having a rear-end portion, a specimen chamber connected with a front-end portion of the column and an aperture member disposed in a front end of the column within the specimen chamber. The aperture member is attached or detached by rotating the aperture member along a given plane that lies along the direction of a path of the beam.

European Patent application 2950324 discloses a charged particle apparatus including an arrangement configured to define a particle beam path for inspecting an object. The apparatus further includes a differential pressure module having a differential pressure aperture that may be configured such that in the operating position the differential pressure aperture separates two vacuum zones of the charged particle optical apparatus. More specifically, there is described a positioning arm that extends through a vacuum enclosure of the particle optical apparatus and said arm is arranged into an operating position in which the particle beam path passes through the differential pressure aperture.

U.S. Pat. No. 7,781,743 provides a charged particle beam system equipped with a charged particle optics and means of evacuation for evacuating the charged particle optics including: vacuum vessel, a non-evaporable getter pump which connects with the vacuum vessel as a subsidiary vacuum pump and a valve interposed between the vacuum vessel and the non-evaporable getter pump. In this case the method for evacuation requires valves and rough pumping ports to perform a correct evacuation.

U.S. Pat. No. 6,309,184 discloses a mobile shielding device located between two pumps, capable of providing a complete shielding to the radiating heat transfer. The shielding is obtained by providing a set of shielding metals including shape memory elements capable of assuming two different configurations. In this patent the conductance is variable, as a function of the temperature resulting from the radiation from the getter pump towards the turbo pump. This device is not compatible with optical systems because it does not intercept the beam.

US patent application 2013087704 describes a gas field ionization source characterized in that the aperture diameter can be set to any of at least two different values or the distance from the apex of the emitter to the extraction electrode can be set to any of at least two different values.

US patent application 20110139986 describes an electron microscope using a generically defined driving mechanism to move a plurality of orifices to set the proper pressure between two electron microscope regions; similarly, in the same field, US patent application 20090045337 describes a generic drive mechanism for moving aperture stops.

U.S. Pat. No. 6,967,335 describes the use of appropriate manipulation mechanisms for specimen/sample in electronic microscopes, comprising actuators, such as thermal micro-actuators, electrostatic micro-actuators, stick-slip piezoelectric micro-actuators, piezo bimorph micro-actuators, comb drive micro-electromechanical system (MEMS) actuators, and memory alloy micro-actuators.

EP patent 1526563 describes a variable aperture achieved through the reciprocal position adjustment of two members, driven preferably by piezo-drives as means for moving a member; the members can be moved, e.g., by stepping motors, by thermal expanding materials or memory metals that can move a member, or by any other means that are capable of moving a member within the micrometer scale.

Japanese patent application JPH0636166 discloses a two slit mass spectrometer, one fixed and one movable according to many generically described variants.

The above mentioned solutions have several disadvantages, as the aperture of the objective lens must be controlled by means of automatic arms, or complex systems requiring the use of vacuum motors, i.e. vacuum-compatible electro-magnetic motors or piezo-electric motors. The former type of motors requires lubricants that may contaminate the specimen with long chains of hydrocarbons, especially in high vacuum observations, while the latter type of motors may produce particulate that migrates onto the specimen, strongly compromising the microscopy measurement.

Both piezo-electric and electromagnetic motors are bulky and reduce the possibility to introduce or optimally position the different detectors that may be needed for a specific analysis. In particular, they may interpose between the specimen and other detectors thus limiting the portion of particles or photons reaching the detector.

Purpose of the present invention is to overcome the drawbacks of the prior art with particular reference to the use of vacuum motors, and in a first aspect thereof consists in a vacuum equipment comprising a first stage and a second stage wherein the first and second stage are in fluid communication through a separation stage having a channel with an aperture in its terminal part, said channel aperture having an area A, wherein said terminal part is in tight contact with a perforated shutter that comprises at least two apertures, one having an area equal to or higher than 0.9*A and one having an area Ar comprised between 0,00001*A and 0.01*A, at least one of said shutter apertures being aligned and centered with respect to said channel aperture by the actuation of a shape memory alloy element.

The invention will be further illustrated with the help of the following figures, wherein.

In the above-referenced figures only the essential elements for the invention comprehension have been illustrated, whereas ancillary elements not necessary for the invention understanding, such as a current supply source, have not been shown since they are ordinary means known in the technical field. Moreover, element dimensions and dimensional ratios in some cases have been altered to improve their readability, with particular but not exclusive reference to the SMA wire diameter.

Shape memory alloys are characterized by a transition between two phases, one stable at a lower temperature, the so-called Martensite phase, and one stable at a higher temperature, the so-called Austenite phase. A shape memory alloy is characterized by four temperatures, Mf, Ms, As, Af: Mf is the temperature below which the shape memory alloy is completely in the Martensite phase, i.e. it has a martensitic structure, while Af is the temperature above which the shape memory alloy is fully in the Austenite phase, i.e. it has an austenitic structure, and Ms, As are the temperatures at which the transition to the Martensite phase and Austenite phase starts, respectively.

Wires made of a shape memory alloy, also known as SMA wires, can be trained to change their shape when temperature changes from below Mf to above Af, and vice versa. Processing and training of SMA wires are widely known procedures in the field, as exemplified by "Shape Memory Alloy Shape Training Tutorial" dating back to the Fall 2004 training section "ME559—Smart Materials and Structures".

Figure 1A:
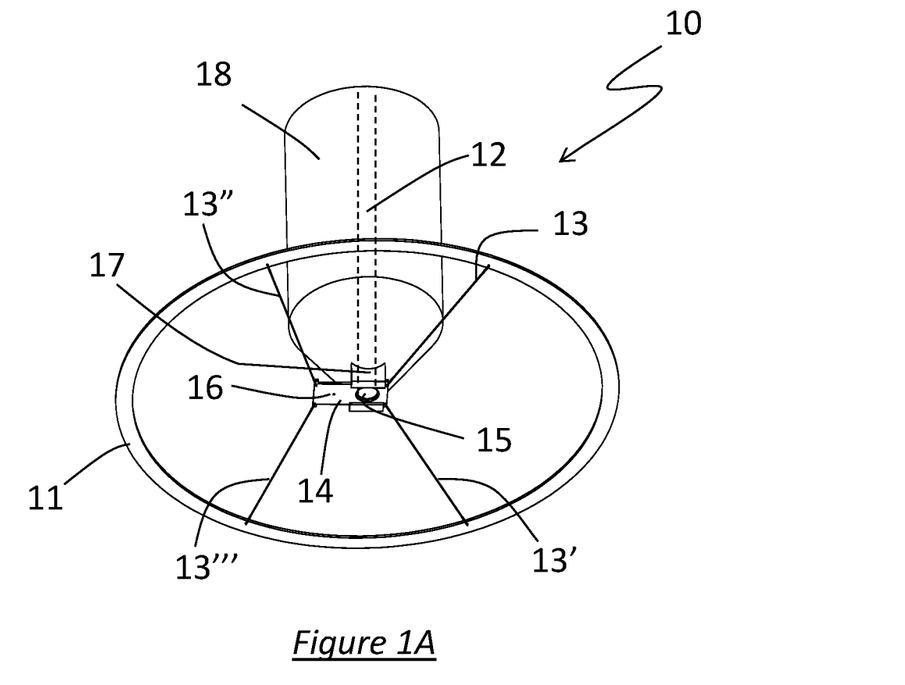
FIGS. 1A and 1B show a schematic bottom perspective view of a first embodiment of a vacuum equipment stages separation made according to the present invention, with the perforated shutter in two different positions.
Figure 1B:
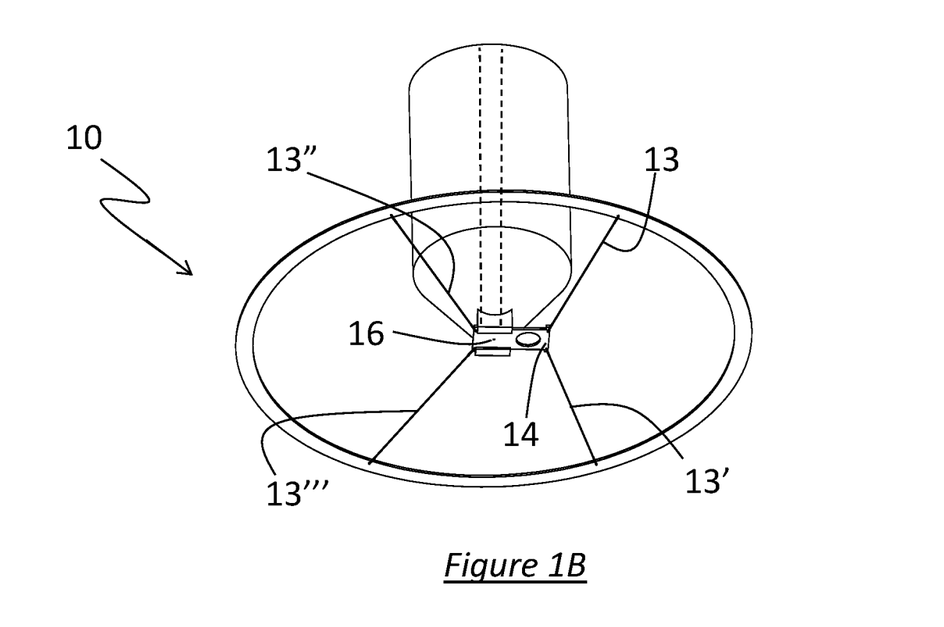

The first embodiment according to the present invention is illustrated in FIGS. 1A and 1B, that show a schematic bottom perspective view of the separation stage 10. Particularly, there is shown a circular frame 11, a beam guide structure 18 having a channel 12 for letting an ion source pass therethrough, with an aperture of area A in its terminal part, and a perforated shutter 14 positioned just below and in tight contact with said terminal part. A support 17 holds the perforated shutter 14 and the latter is able to slide along two internal grooves of support 17 that keep the upper surface of the perforated shutter 14 in tight contact with the aperture of channel 12.

The perforated shutter 14 comprises at least two circular apertures 15 and 16, the former having an area equal to or higher than 0.9*A and the latter having an area Ar comprised between 0,00001*A and 0.01*A, and one of said shutter apertures 15, 16 is aligned and centered with respect to said aperture of channel 12 by the actuation of a shape memory alloy element, the not centered shutter aperture being moved outside of channel 12.

In the first embodiment shown in FIGS. 1A and 1B, the perforated shutter 14 is moved by means of four SMA wires 13, 13', 13", 13''' with anchoring points located at the four corners of the perforated shutter 14, that has a substantially rectangular shape, and at corresponding positions along the circular frame 11.

The apertures 15, 16 can be made in a single piece of metal as shown in FIGS. 1A and 1B, since the surfaces in proximity of the beam and of the specimen should preferably be made of electrically conductive material in order to avoid charge collection on the surface that could generate undesired electric fields. Alternately, the perforated shutter could be realized for example with an electrically non-conductive ceramic material covered by a metal coating in such a way that the central portions and the lateral portions are separated by uncoated strips.

In order to move the perforated shutter 14 and change the aperture, the SMA wires 13, 13', 13", 13''' are actuated by heating through the supply of electric current, such that they will heat up and reach the temperature above which the alloy is fully in the Austenite phase. SMA wires are alternately actuated in pairs, more specifically the concurrent actuation of wires 13 and 13' will pull the perforated shutter 14 to the right for the alignment of the smaller aperture 16 (FIG. 1B), while the concurrent actuation of wires 13" and 13''' will pull the perforated shutter 14 to the left for the alignment of the larger aperture 15 (FIG. 1A). The precise alignment of apertures 15, 16 is assured by end stops (not shown) formed on the shutter support 17 against which the perforated shutter 14 abuts when pulled in either direction by the two pairs of SMA wires.

A more complex alternate embodiment (not shown), can be made with two perforated shutters independently moved by means of four pairs of SMA elements, in which a first shutter comprises the two apertures and is moved in order to center one of its two apertures along the beam axis, and the second shutter is moved in order to close the other not centered aperture of the first shutter. This solution allows a smaller displacement of the shutters in that the not centered aperture need not be moved outside of channel 12 since it is closed by the second shutter. Needless to say, to ensure uniformity of actuation and applied force equilibration, the shape memory alloy wire diameters shall be essentially equal to each other (within a ±5% tolerance).

In another alternate variant (not shown), applicable to both the first embodiment and the alternate embodiment, a shutter can be moved by two antagonistic wires arranged at opposite positions in order to have a single wire with one anchoring point on each side of the shutter, rather than a pair of wires with two anchoring points as in FIGS. 1A, 1B.

Figure 2A:
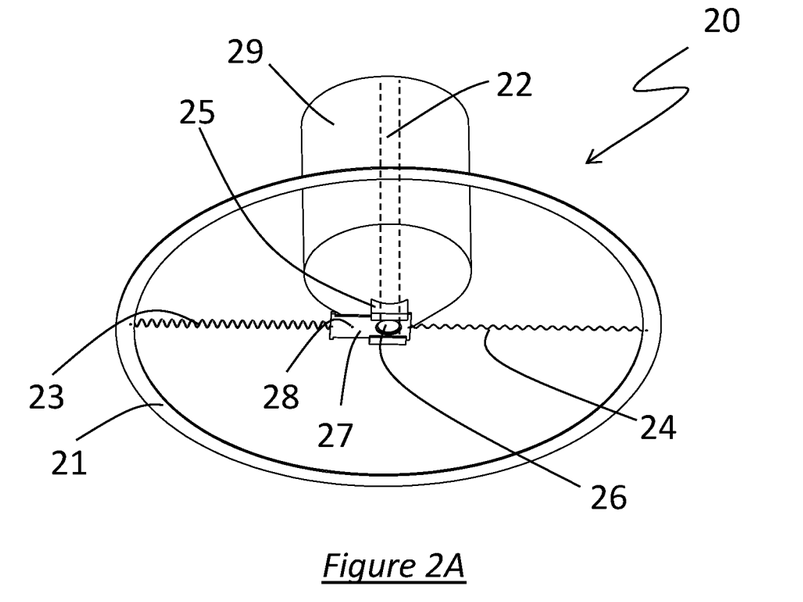
FIGS. 2A and 2B are views similar to FIGS. 1A and 1B of a second embodiment of the invention.

In a second embodiment shown in FIGS. 2A and 2B a separation stage 20 includes a circular frame 21, a beam guide structure 29 having a channel 22 for letting an ion source pass therethrough, with an aperture in its terminal part, and a perforated shutter 27 positioned just below and in tight contact with said terminal part. A support 25 holds the perforated shutter 27 and the latter is able to slide along two internal grooves of support 25 that keep the upper surface of the perforated shutter 27 in tight contact with the aperture of channel 22. The perforated shutter 27 comprises at least two circular apertures 26 and 28 and one of said shutter apertures is aligned and centered with respect to said channel aperture by the actuation of a shape memory alloy element.

Figure 2B:
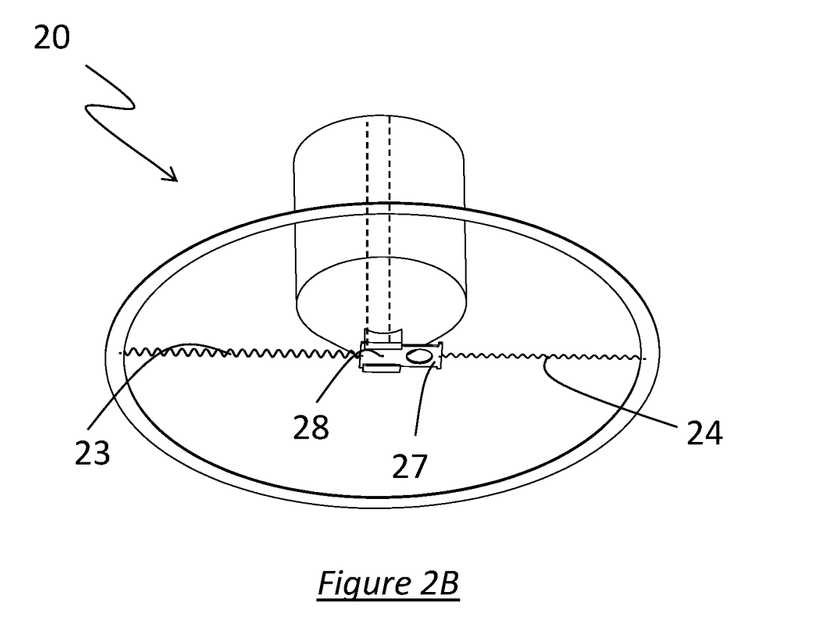

In this case, the SMA element is a SMA spring 24 whereas element 23 is a standard spring such that when the SMA spring 24 is actuated by applying a voltage and reaches the temperature above which the alloy is fully in the Austenite phase, the SMA spring 24 gets shorter and pulls the perforated shutter 27 towards the right extending the standard spring 23 such that the smaller aperture 28 is aligned with the beam axis (FIG. 2B). When the SMA spring 24 is deactivated, spring 23 pulls back the perforated shutter 27 to the left such that the larger aperture 26 is aligned with the beam axis (FIG. 2A).

Figure 3:
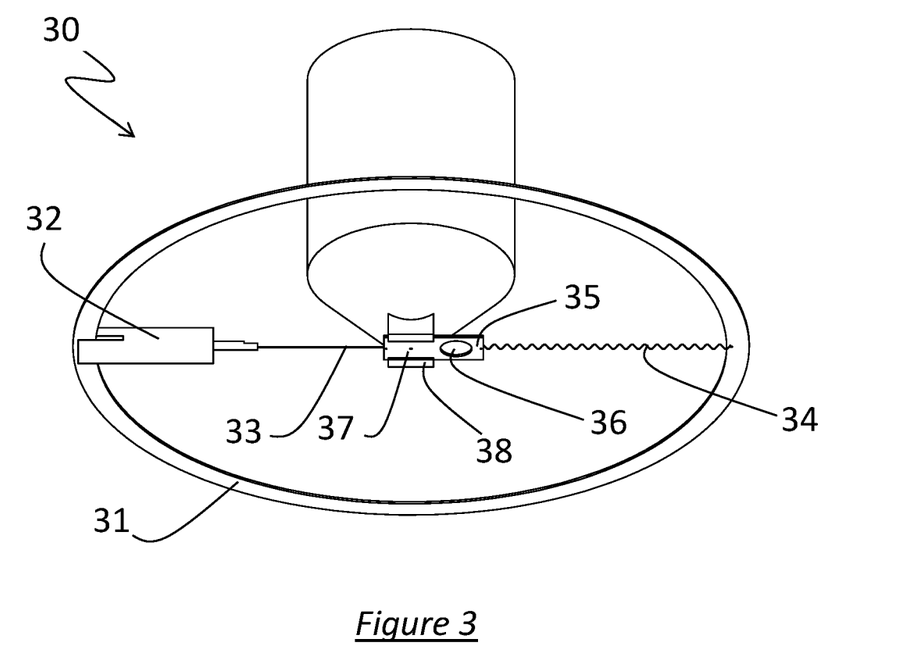
FIG. 3 shows a schematic bottom perspective view of a third embodiment of the invention.

In a third embodiment shown in FIG. 3, a separation stage 30 differs from the separation stage 20 of the second embodiment in that spring 23 is replaced by a mechanism 32 similar to a push-push system like those used in retractable ballpoint pens, said mechanism 32 being mounted on a circular frame 31 and connected to the perforated shutter 37 through an inextensible wire 33 at a position opposite to a SMA spring 34 that operates like the above-described SMA spring 24. In this case, however, the SMA spring 34 acts on a spring (not shown) inside mechanism 32 for alternating at each activation between two different end stops that define the travel of the perforated shutter 37 along its shutter support 38 upon deactivation of the SMA spring 34.

In other words, mechanism 32 represents a bistable system with a first stable position corresponding to the smaller aperture 37 being aligned with the beam axis and a second stable position corresponding to the larger aperture 36 being aligned with the beam axis, and the SMA spring 34 is activated only to change the position inside of mechanism 32. This means that the SMA spring 34 can be immediately deactivated after the shutter has moved from one position to the other, whereas in the second embodiment the SMA spring 24 must remain activated in order to keep the smaller aperture 28 aligned with the beam axis and in the first embodiment a pair of SMA wires (either 13, 13' or 13", 13''') must remain activated in order to keep one of the apertures 15, 16 aligned with the beam axis.

Figure 4:
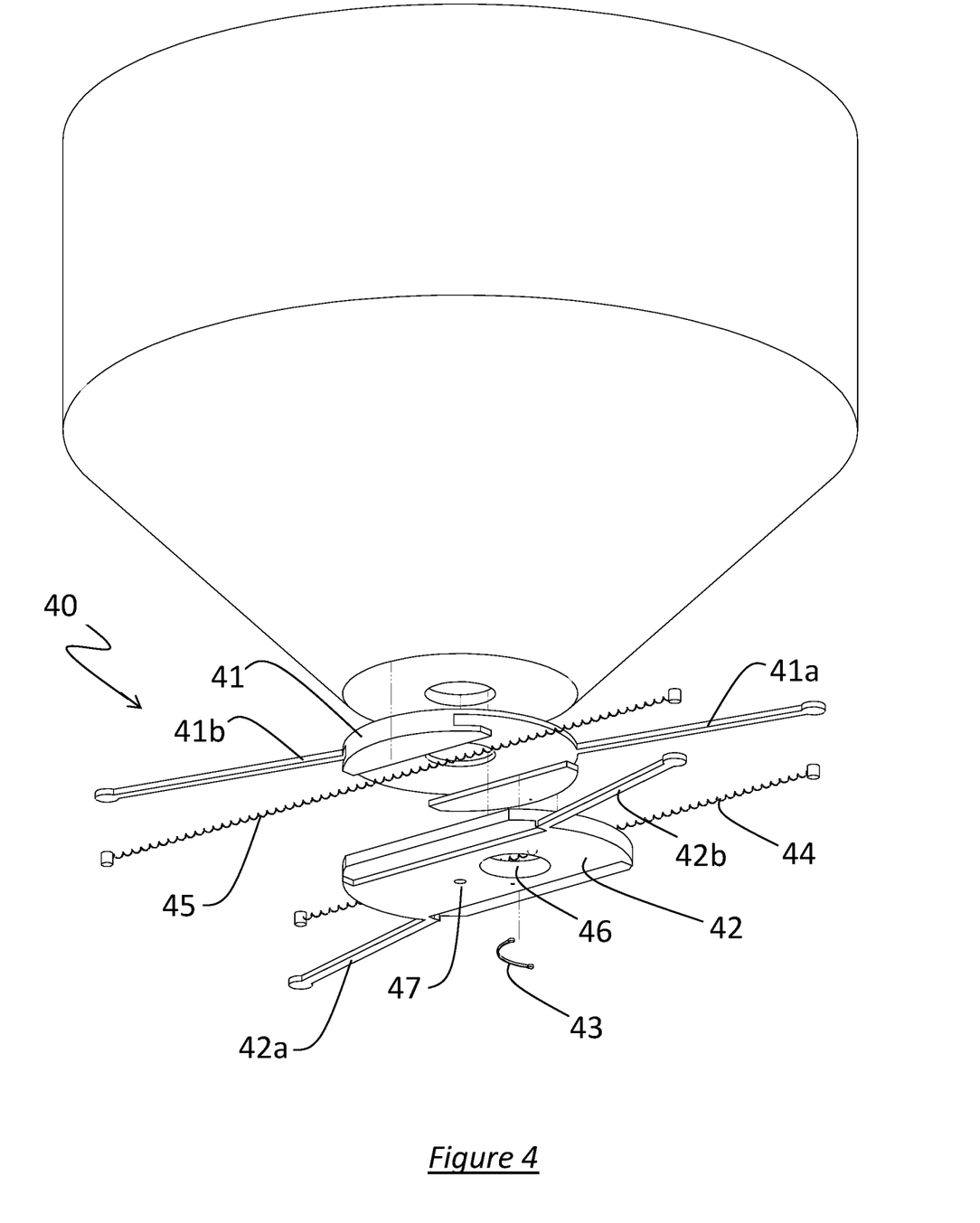
FIG. 4 shows a bottom exploded view of a fourth embodiment of the invention.

FIG. 4 shows an exploded bottom view of a fourth embodiment in which a separation stage 40 includes a shutter support 41, comprising the grooves aimed at guiding the sliding movement of the shutter and keeping it in tight contact with the terminal part of the beam channel, a perforated shutter 42, an arcuate flexure 43 and SMA springs 44, 45. As better seen from the assembled views of FIGS. 5 to 7, the shutter support 41 is provided with opposite arms 41a, 41b extending diagonally outwards with respect to the sliding direction of the perforated shutter 42, which is in turn provided with similar arms 42a, 42b respectively located on the other side of the separation stage 40 with respect to arms 41b, 41a. In this way, the first SMA spring 44 is connected between arms 41a and 42a on a first side "a" of the separation stage 40, and the second SMA spring 45 is similarly connected between arms 41b and 42b on the opposite side "b" such that said SMA springs 44, 45 extend substantially along the sliding direction of the perforated shutter 42.

Flexure 43 is pivoted between support 41 and shutter 42 with its arcuate shape contained in a plane parallel to the sliding plane of shutter 42, the positions of its pivoting points being selected such that it provides a locking force on shutter 42 at both end-of-travel positions of the latter, since the moving pivot on shutter 42 goes from one side to the other with respect to the fixed pivot on support 41. In this configuration, all the above-mentioned elements can be previously assembled in an integrated device that is then mounted on the objective lens.

Figure 5:
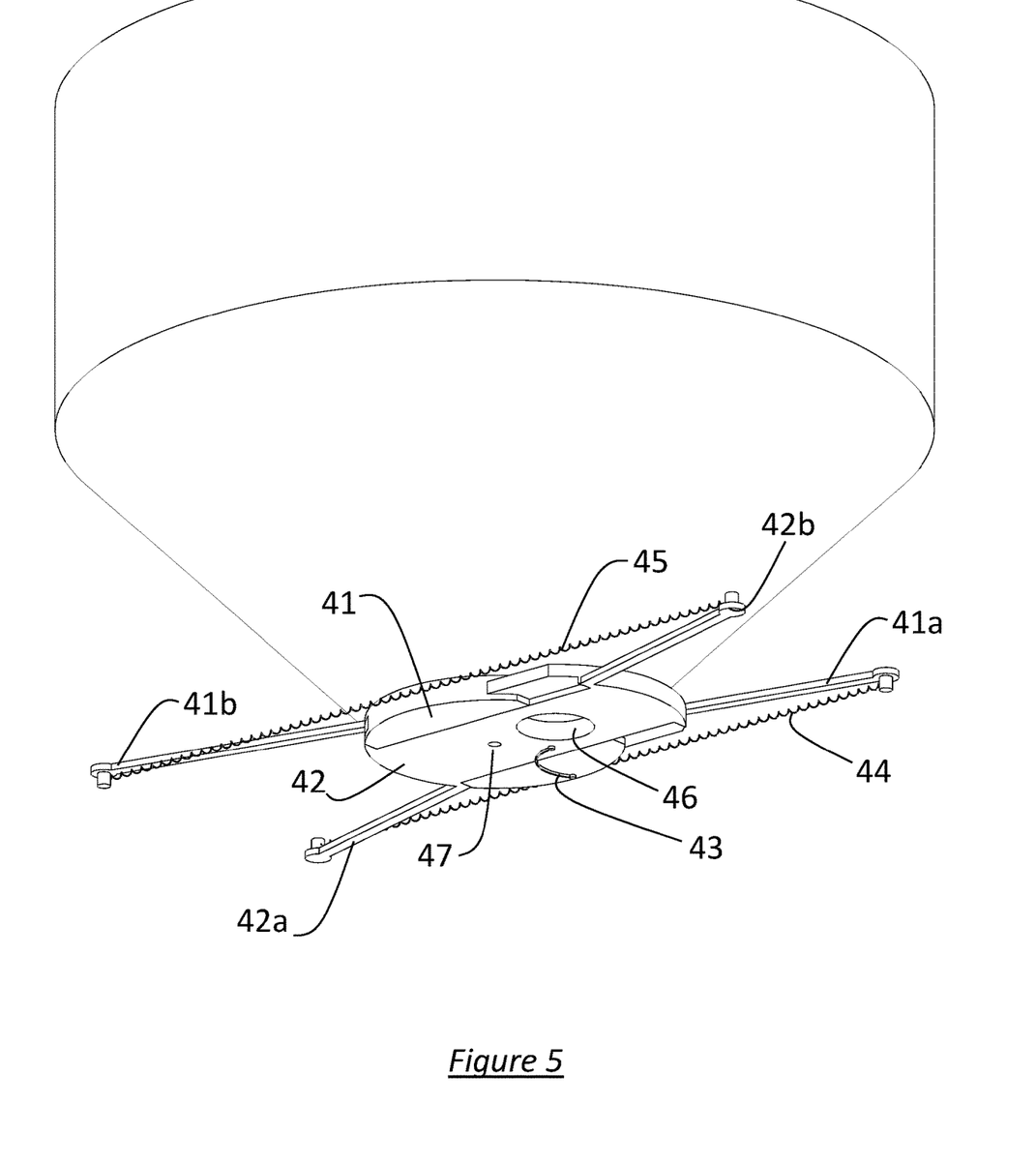
FIG. 5 shows a bottom perspective view of the fourth embodiment of FIG. 4 in the assembled condition.
Figure 6:
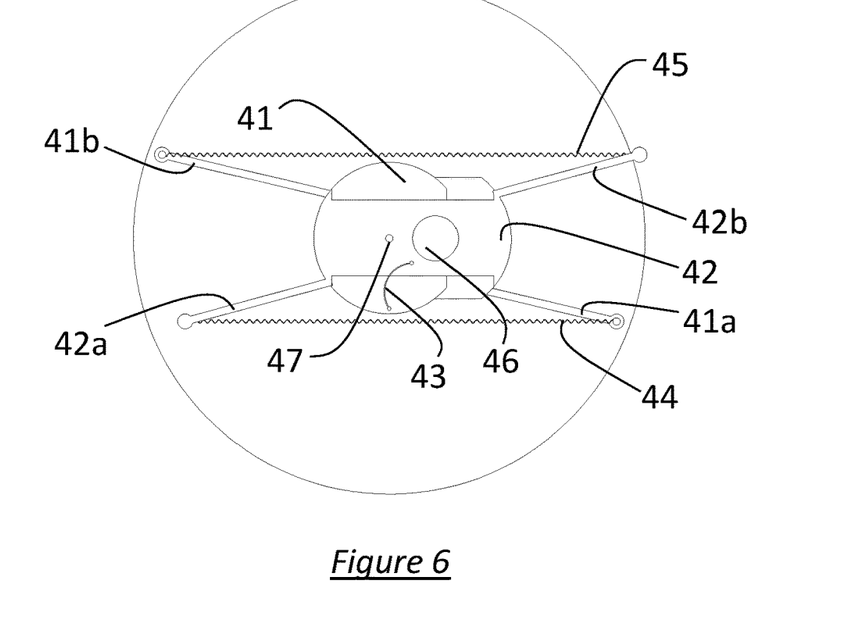
FIGS. 6 and 7 show a bottom view of the fourth embodiment of FIG. 5 with the perforated shutter in two different positions.
Figure 7:
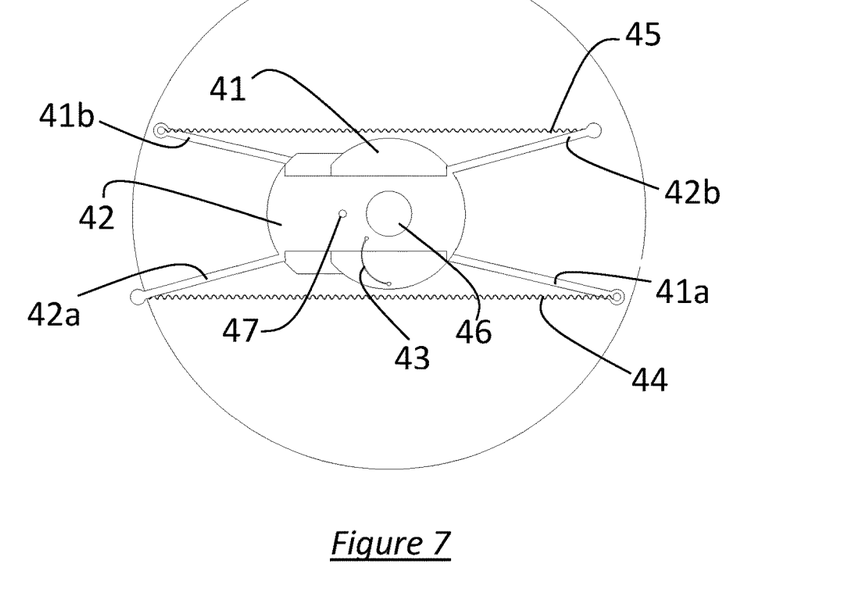

Starting from the position shown in FIGS. 4 to 6, in which the smaller aperture 47 is aligned with the beam axis, the larger aperture 46 is moved into alignment by activating the SMA spring 45 that is shortened and thus pulls the shutter arm 42b towards the support arm 41b (leftwards in FIGS. 6, 7), while the SMA spring 44 is extended since the shutter arm 42a is moved away from the support arm 41a. This action allows to slide the perforated shutter 42 and change the aperture from the smaller one 47 to the larger one 46, the opposite movement being obviously achieved by activating the SMA spring 44.

Figure 8:
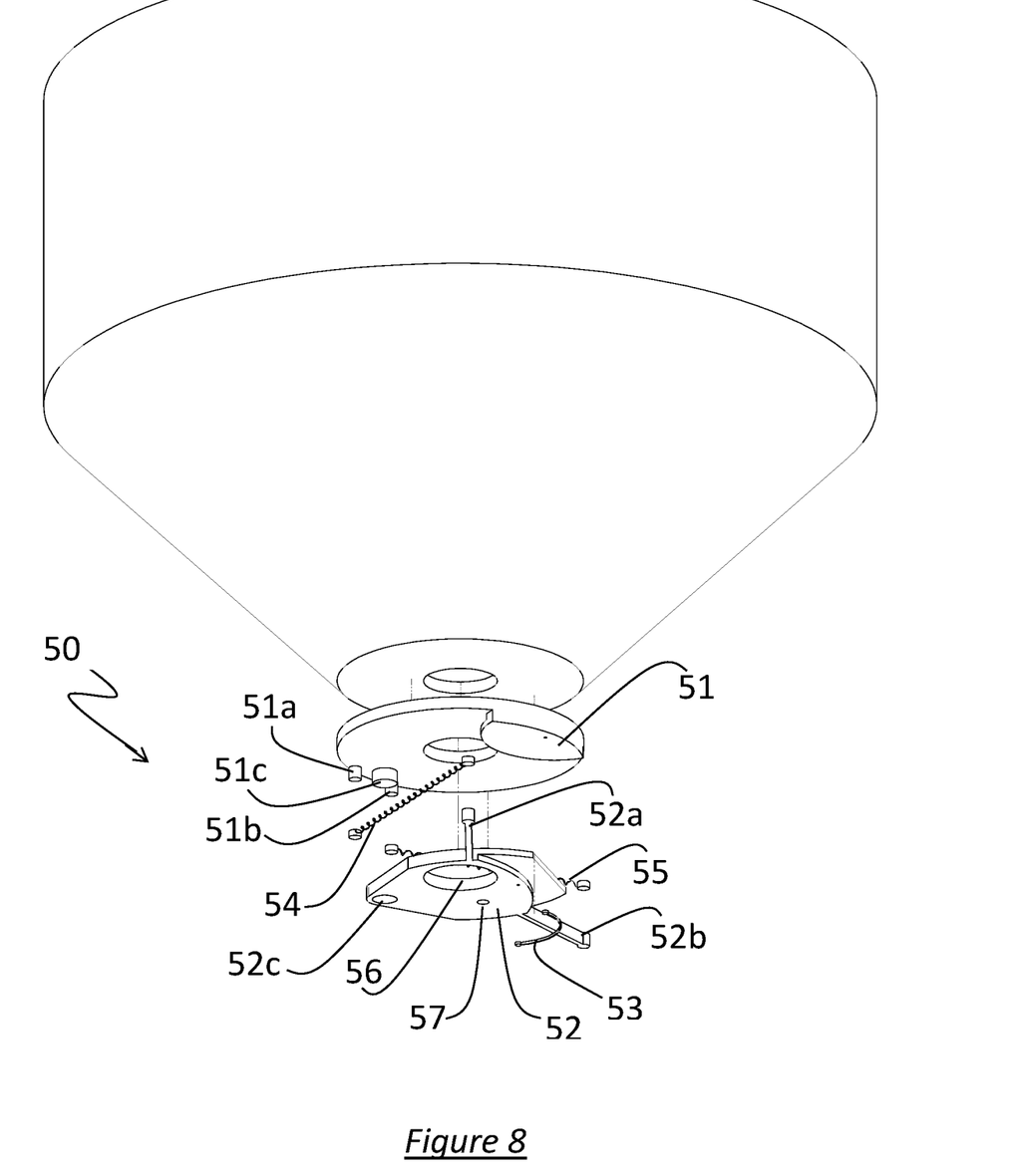
FIG. 8 shows a bottom exploded view of a fifth embodiment of the invention.

FIG. 8 shows an exploded bottom view of a fifth embodiment that is conceptually similar to the fourth embodiment but concerns a shutter with a rotating movement, rather than a sliding movement as in the first four embodiments. In this case a separation stage 50 includes a shutter support 51, comprising a single groove aimed at guiding the rotating movement of the shutter and keeping it in tight contact with the terminal part of the beam channel, a perforated shutter 52, an arcuate flexure 53 and SMA springs 54, 55. As better seen from the assembled views of FIGS. 9 to 11, the shutter support 51 is provided with two pegs 51a, 51b and a pivot 51c extending downwards at a position opposite the guiding groove (with pivot 51c located between the two pegs 51a, 51b), while the perforated shutter 52 is provided with radially extending arms 52a, 52b symmetrically arranged with respect to a seat 52c for pivot 51c and respectively located on the same side of the separation stage 50 with respect to pegs 51a, 51b. In this way, the first SMA spring 54 is connected between peg 51a and arm 52a on a first side "a" of the separation stage 50, and the second SMA spring 55 is similarly connected between peg 51b and arm 52b on the opposite side "b" such that said SMA springs 54, 55 extend substantially perpendicular to each other.

Flexure 53 is pivoted between support 51 and shutter 52 with its arcuate shape contained in a plane parallel to the rotation plane of shutter 52, the positions of its pivoting points being selected such that it provides a locking force on shutter 52 at both end-of-travel positions of the latter, since the moving pivot on shutter 52 goes from one side to the other with respect to the fixed pivot on support 51. In this configuration, all the above-mentioned elements can be previously assembled in an integrated device that is then mounted on the objective lens.

Figure 9:
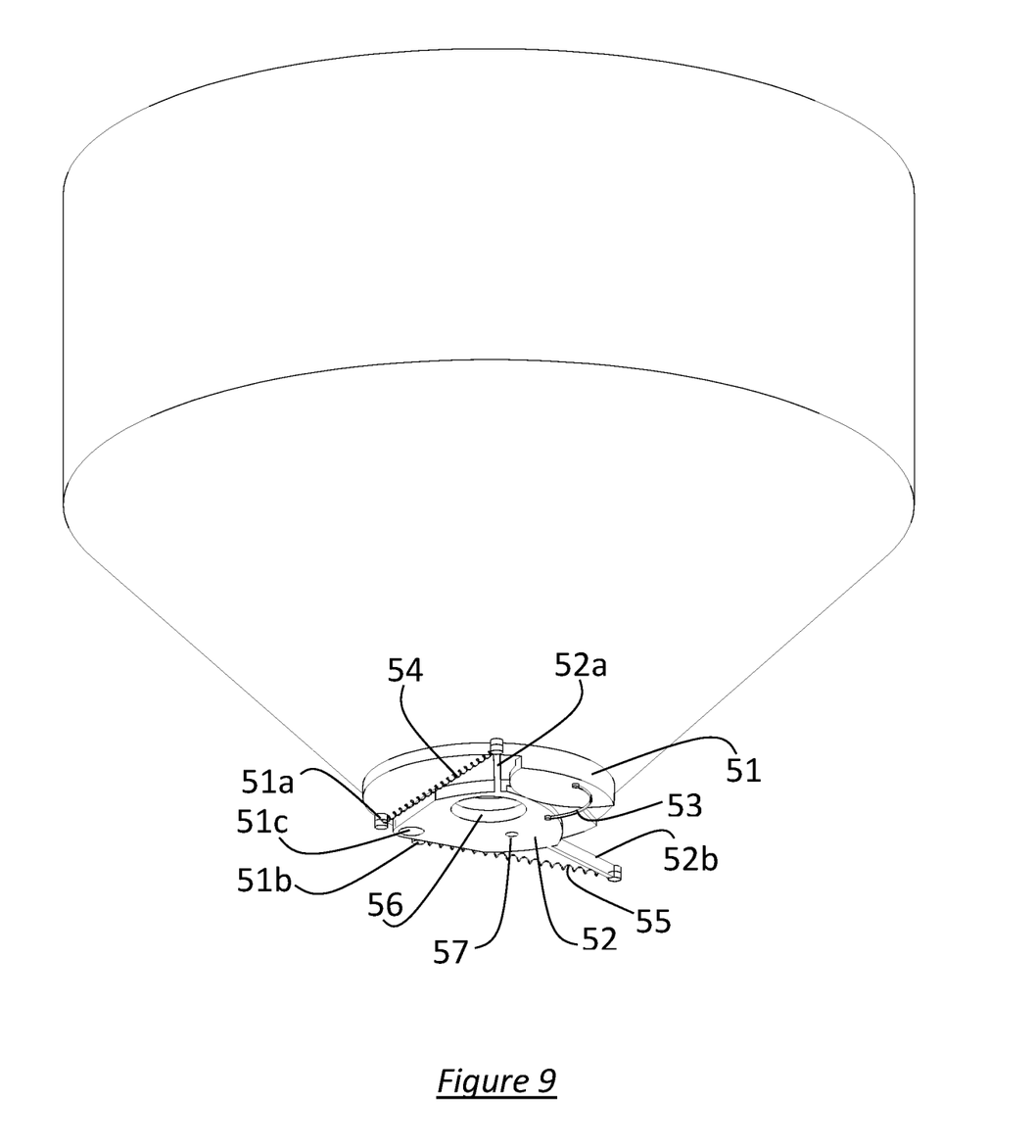
FIG. 9 shows a bottom perspective view of the fifth embodiment of FIG. 8 in the assembled condition.
Figure 10:
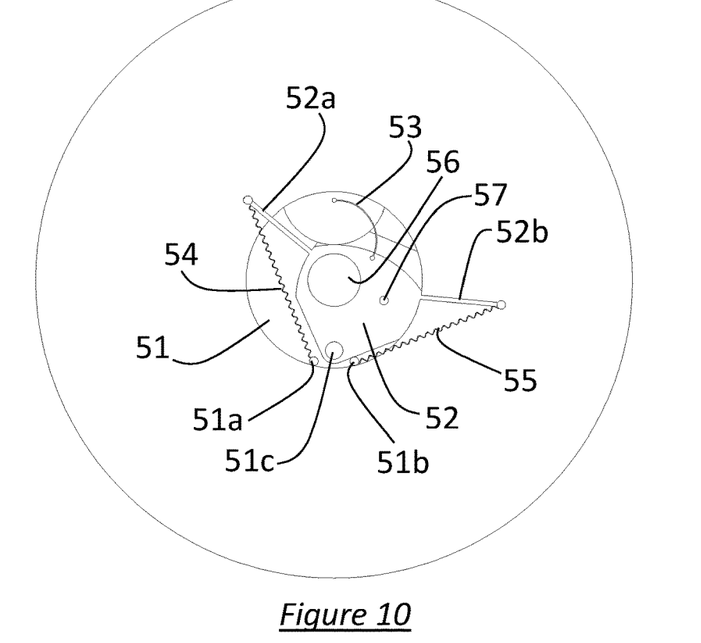
FIGS. 10 and 11 show a bottom view of the fifth embodiment of FIG. 9 with the perforated shutter in two different positions.
Figure 11:
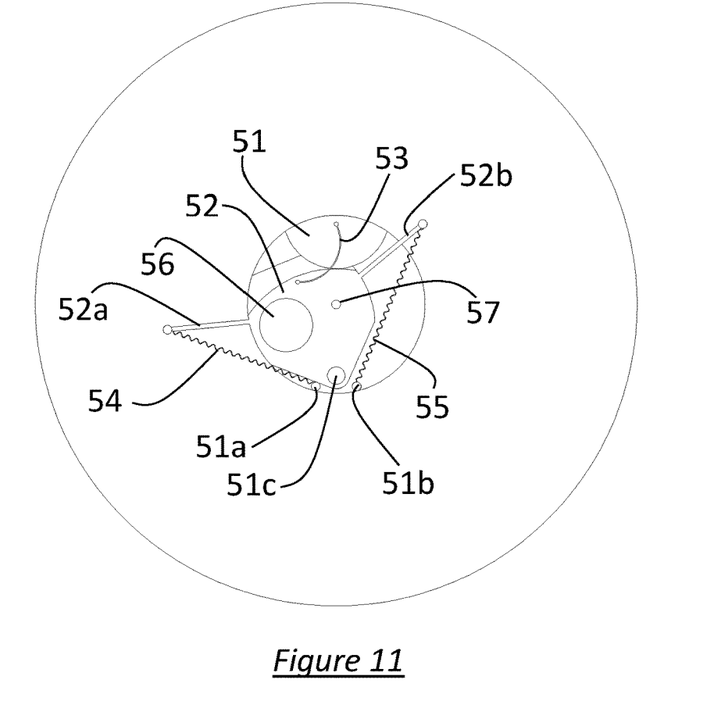

Starting from the position shown in FIGS. 8 to 10, in which a larger aperture 56 is aligned with the beam axis, a smaller aperture 57 is moved into alignment by activating the SMA spring 54 that is shortened and thus pulls the shutter arm 52a towards peg 51a causing a rotation of shutter 52 around pivot 51c (counter-clockwise in FIGS. 10, 11), while the SMA spring 55 is rotated and extended since the shutter arm 52b is moved away from peg 51b. This action allows to rotate the perforated shutter 52 and change the aperture from the larger one 56 to the smaller one 57, the opposite movement being obviously achieved by activating the SMA spring 55.

In order to limit gas flow from the sample chamber to the microscope column or prevent parasite gas flow during high pressure observations, it is possible to introduce an elastomeric gasket (not shown) between the perforated shutter and the shutter support. The friction between the gasket and the perforated shutter helps keeping the latter in a fixed position after the SMA elements have been activated to move the shutter in the desired position. In this case, the flexure is unnecessary since the locking force is provided by the gasket friction, but this also implies the use of SMA elements of greater diameter that must provide a higher force to overcome said friction.

In order to use wires with smaller diameters, for faster actuation/de-actuation, it is preferable that the separation stage does not include the elastomeric gasket but is made so as to satisfy two requirements:

the clearance between the perforated shutter and the shutter support must be small enough so that the parasite gas flow rate is much lower, preferably at least one order of magnitude lower, than the flow rate of the gas flowing in the smaller aperture;

the perforated shutter must oppose a low force towards the actuation.

Generally speaking the term "tight contact" is to be interpreted in the above context, i.e. the amount of parasite gas is at least one order of magnitude less than the amount flowing in the smaller aperture.

The principle and the details mentioned and described above can be applied not only to electron microscope techniques (SEM) or charged particle beams but also to scanning helium ion microscopes (SHIM, HeIM or HIM).

The invention is not limited to any specific shape memory alloy material, even though preferred are Ni—Ti based alloys, such as the alloy commonly known with the trade name of Nitinol, whose basic properties are described in U.S. Pat. No. 4,830,262. The newer and improved shape memory alloys described in U.S. Pat. Nos. 8,152,941 and 8,430,981 in the name of SAES Smart Materials may also be employed.

In particular the term "Ni—Ti based" shape memory alloy encompasses shape memory alloys with a preponderant content of nickel and titanium (at least 60 atomic percent, at %), while additional elements may impart different properties such as lower hysteresis in case of Ni—Ti—Cu alloys, described for example in the U.S. Pat. No. 4,565,589, or higher transformation temperature as in the case of Ni—Ti—Hf alloys, described for example in the U.S. Pat. No. 5,114,504.

When the SMA element is in the form of a wire, its diameter is comprised between 0.01 and 0.50 mm but the best results are obtained with SMA wires with diameter comprised between 0.01 and 0.15 mm to reduce the screening of the sensor placed above the sample. Moreover, a larger diameter of the SMA actuator, both for wires and springs, implies an increase of thermal inertia thus producing a longer cool down time of the actuator, which affects the minimum time needed to perform the switch between the two positions.

However, as previously mentioned, in the case of an embodiment with the elastomeric gasket arranged between the perforated shutter and the shutter support it is necessary to use SMA actuators (wires or springs) of larger diameter, preferably between 0.08 and 0.50 mm.

In this respect, it is important to underline that since shape memory alloy wires are real objects, departures from a circular section are possible, whereby the term "diameter" is to be intended as the diameter of the smallest enclosing circle.

The clearance between the perforated shutter and the shutter support and the correct actuation can be achieved by means of a suitable machining of the perforated shutter and shutter support. In particular, the average surface roughness (Ra) of their engaging portions should be no more than 0.1 micron and the clearance between the perforated shutter and the shutter support should not be larger than 20 micron but preferably smaller than 5 micron. Finally, the minimum clearance between the perforated shutter and the shutter support should be greater than 2 micron in every position of the travel of the perforated shutter, in order to prevent any interference during the motion.

Further embodiments can be easily obtained by a person skilled in the art through the combination of the features of the above-described embodiments, for example the flexure can be present also in the first two embodiments (in the absence of the gasket).

A method for operating a vacuum equipment according to any of the previous embodiments provides that the actuation of the shape memory alloy element(s) is controlled and driven by an operational feedback, such as a reading of the SMA temperature (e.g. by measuring the electrical resistance) or of the shutter's position through suitable position sensors (e.g. optical, resistive or magnetic sensors).

The invention claimed is:

1. A vacuum equipment, comprising:
at least a first stage and a second stage,
wherein the first and second stage are in fluid communication through a separation stage having a channel with an aperture in its terminal part, said aperture of said channel having an area A,
wherein said terminal part is in tight contact with a perforated shutter,
wherein said perforated shutter comprises at least two apertures, a larger aperture having an area equal to or higher than 0.9*A and a smaller aperture having an area Ar comprised between 0.00001*A and 0.01*A,
wherein at least one of said shutter apertures is aligned and centered with respect to said aperture of the channel by the actuation of at least one shape memory alloy element, and
wherein said shutter apertures are alternately closed by a second shutter that is independently moved by separated shape memory alloy elements.

2. The vacuum equipment according to claim 1, wherein said at least one shape memory alloy element comprises one or more shape memory alloy wires having a diameter comprised between 0.01 mm and 0.50 mm.

3. The vacuum equipment according to claim 1, wherein said at least one shape memory alloy element is a shape memory alloy spring.

4. The vacuum equipment according to claim 1, wherein said shutter apertures are holes made in a single piece of metal.

5. The vacuum equipment according to claim 1, wherein the position of the perforated shutter is controlled by antagonistic actuation of a plurality of shape memory alloy elements.

6. The vacuum equipment according to claim 1, wherein the position of the perforated shutter is controlled by at least a shape memory alloy element working against an elastic return element.

7. The vacuum equipment according to claim 6, wherein the elastic return element is part of a bistable mechanism connected to the perforated shutter so as to define its end-of-travel positions, with a first stable position corresponding to the smaller aperture being aligned with the aperture of the channel and a second stable position corresponding to the larger aperture being aligned with the aperture of the channel, and the shape memory alloy element is activated only to change the positions inside of said bistable mechanism.

8. A vacuum equipment, comprising:
at least a first stage and a second stage,
wherein the first and second stage are in fluid communication through a separation stage having a channel with an aperture in its terminal part, said aperture of said channel having an area A,
wherein said terminal part is in tight contact with a perforated shutter,
wherein said perforated shutter comprises at least two apertures, a larger aperture having an area equal to or higher than 0.9*A and a smaller aperture having an area Ar comprised between 0.00001*A and 0.01*A,
wherein at least one of said shutter apertures is aligned and centered with respect to said aperture of the channel by the actuation of at least one shape memory alloy element, and
wherein the perforated shutter is guided and supported in its movement by a shutter support provided with two opposite guide grooves in which the perforated shutter is slidingly engaged or with a pivot on which the perforated shutter is pivoted and an opposite guide groove in which the perforated shutter is slidingly engaged.

9. The vacuum equipment according to claim 3, wherein antagonistic shape memory alloy springs are arranged between the shutter support and the perforated shutter at opposite sides thereof.

10. The vacuum equipment according to claim 8, wherein the shutter support is provided with stops that define the end-of-travel positions of the perforated shutter.

11. The vacuum equipment according to claim 8, further comprising an arcuate flexure pivoted between the shutter support and the perforated shutter with its arcuate shape contained in a plane parallel to the moving plane of the perforated shutter, the positions of its pivoting points being selected such that it provides a locking force on the perforated shutter at both end-of-travel positions of the latter.

12. The vacuum equipment according to claim 8, wherein the average surface roughness Ra of the engaging portions of the perforated shutter and of the guide groove(s) of the shutter support is equal to or better than 0.1 μm.

13. The vacuum equipment according to claim 8, wherein the clearance between the perforated shutter and the shutter support is comprised between 2 and 20 μm in every position along the travel of the perforated shutter.

14. The vacuum equipment according to claim 8, wherein a gasket is interposed between the perforated shutter and the shutter support, and the shape memory alloy wire(s) diameter is comprised between 0.08 mm and 0.50 mm.

15. The vacuum equipment according to claim 8, wherein no additional element is interposed between the perforated shutter and the shutter support, and the shape memory alloy wire(s) diameter is comprised between 0.01 mm and 0.15 mm.

16. The vacuum equipment according to claim 1, wherein said vacuum equipment is a scanning electronic microscope or a scanning helium ion microscope.

17. The vacuum equipment according to claim 8, wherein the clearance between the perforated shutter and the shutter support is comprised between 2 and 5 μm in every position along the travel of the perforated shutter.

18. The vacuum equipment according to claim 8, wherein the perforated shutter is guided and supported in its movement by a shutter support provided with a pivot on which the perforated shutter is pivoted and an opposite guide groove in which the perforated shutter is slidingly engaged.

19. The vacuum equipment according to claim 8, wherein said vacuum equipment is a scanning electronic microscope or a scanning helium ion microscope.

* * * * *